United States Patent [19]
Chen et al.

[11] Patent Number: 5,849,582
[45] Date of Patent: Dec. 15, 1998

[54] BAKING OF PHOTORESIST ON WAFERS

[75] Inventors: Chao-Chen Chen, Hsin-chu; Wei-Kay Chiu, Chin-Chu County, both of Taiwan

[73] Assignee: Taiwan Semiconductor Manufacturing Company, Ltd., Hsin-Chu, Taiwan

[21] Appl. No.: 847,224

[22] Filed: May 1, 1997

[51] Int. Cl.⁶ ................................................ G03C 5/00
[52] U.S. Cl. .................... 430/328; 430/330; 427/512; 427/510; 427/521
[58] Field of Search .................... 430/328, 330; 427/521, 512, 510

[56] References Cited

U.S. PATENT DOCUMENTS

| 4,814,243 | 3/1989 | Ziger | 430/30 |
| 4,824,699 | 4/1989 | Woo et al. | 427/307 |
| 4,988,284 | 1/1991 | Liu et al. | 430/296 |
| 5,306,653 | 4/1994 | Hur | 437/40 |
| 5,431,700 | 7/1995 | Sloan | 29/25.01 |
| 5,620,560 | 4/1997 | Akimoto et al. | 216/41 |
| 5,626,782 | 5/1997 | Maeda | 219/449 |

FOREIGN PATENT DOCUMENTS

| 6-236040 | 8/1994 | Japan | 430/330 |

*Primary Examiner*—Nam Nguyen
*Assistant Examiner*—Steven H. VerSteeg
*Attorney, Agent, or Firm*—George O. Saile; Stephen B. Ackerman

[57] ABSTRACT

A method and apparatus for curing a photoresist that is deposited in liquid form and spun on a surface of a wafer leaving a thin film to be cured. This invention teaches methods for curing the resist with improved thickness control using front side heating.

5 Claims, 3 Drawing Sheets

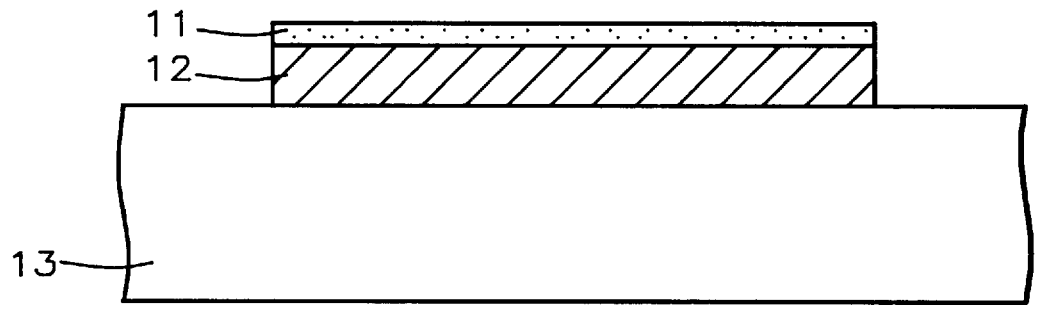
FIG. 1 - Prior Art
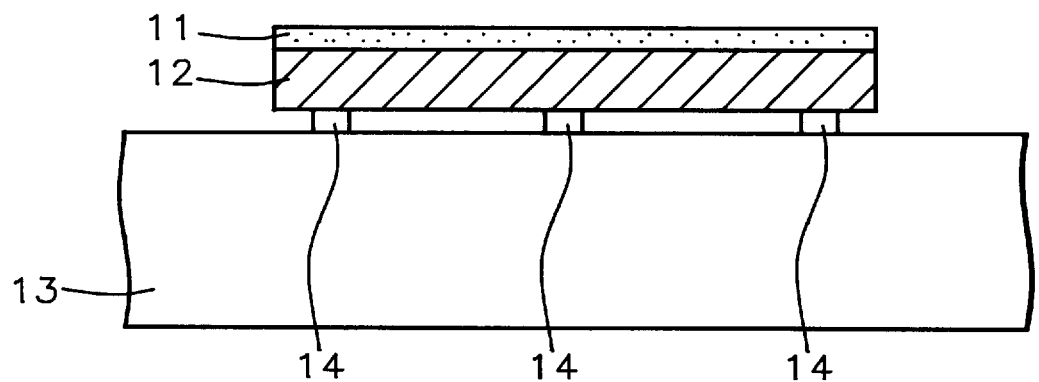
FIG. 2 - Prior Art

BAKING OF PHOTORESIST ON WAFERS

BACKGROUND OF THE INVENTION

(1) Technical Field

This invention is concerned with methods for making semiconductor devices, and more particularly, to the curing of photoresist films used in such fabrication.

(2) Description of the Prior Art

U.S. Pat. No. 5,431,700 issued Jul. 11, 1995 to Ben J. Sloan discloses a wafer baking and chilling apparatus which heats the wafers with a bake plate from the front side. The invention also used gas flow.

U.S. Pat. No. 5,306,653 issued Apr. 26, 1994 to Chang W. Hur shows a method of baking photo resist to make it flow to a desired width.

U.S. Pat. No. 4,814,243 issued Mar. 21, 1989 to David H. Ziger shows an image reversal process using a bake process in an oven.

A wafer for the manufacture of semi-conductive elements is subjected to numerous sequenced operations during photolithography enables the fabrication of all its circuit elements. The use of a thin layer of photo resist on a wafer's surface in conjunction with photolithograhic masks provides the means to transfer the various masking layers onto the semiconductor wafer. The photolithographic mask selectively exposes a portion of photoresist film to actinic light while leaving the masked portion unexposed. The exposed portion makes the photoresist soluble in a base solution and insensitive to light. The unexposed portion is insoluble in the base solution and is photo sensitive.

The development of highly integrated circuit patterns with line widths and spacing in the submicron ranges places increasingly higher demands on image resolution capabilities of the photoresist. Processes involving film thickness, thickness uniformity, resist baking, and intermediate handling have become critical steps in the manufacturing of high speed integrated circuits.

SUMMARY OF THE INVENTION

In the processing of semiconductor wafers for forming integrated circuits, a thin film of material, for example, a photoresist that is suspended in a solvent, is applied to the surface of a wafer. To harden the material, the thin film must be baked and then cooled.

An object of the present invention is to reduce contamination of the wafer by the manner in which the wafer is supported from the back side.

Another object of the present invention is to increase the throughput of the baking process by integrating the hot and cold plates.

Still another object of the present invention is to improve the uniformity of photoresist thickness by controlling the space between the back side of the wafer and the hot plate.

Another object of the present invention is to provide additional front side heating using infra-red radiation which also improves photoresist thickness uniformity by means of direct photo resist heating versus using only the conventional back side plate contact method. The efficiency of back side conduction is dependent on the extent of contact resistance between wafer and hot plate as relating to the magnitude of heat transfer.

BRIEF DESCRIPTION OF THE DRAWINGS

FIG. 1 is a prior art illustration of a contact type photo resist baking system using a back side heating source.

FIG. 2 is a prior art illustration of a proximity type photo resist baking system using a back side heating source.

DETAILED DESCRIPTION OF THE PREFERRED EMBODIMENT

Aspects of the present invention consists of a method and apparatus for baking photo resist uniformly, with increased throughput and yield.

Contamination of a wafer during deposition of liquid photo resist lowers the yield for defect free devices. The wafer's total surface area is susceptible to contamination including its back side. After cleaning, the wafer is placed on a vacuum chuck which can be rotated at high speed. The wafer is centered on the chuck, secured to the chuck by vacuum and spun at a high speed. A measured quantity of photoresist is deposited on the spinning wafer. A combination of surface tension and forces resulting from spinning causes the liquid resist to spread into a uniform, thin film from which the solvents used to liquify the resist quickly escape by evaporation. The wafer is carefully removed from the spinner and placed in a heat controlled environment for baking.

In the semiconductor industry, a hot plate is routinely used for baking a photoresist coated wafer by resting its backside on the top surface of the hot plate. Photoresist baking is done in three steps. The first, "soft bake", is done after spinning and before exposure, the second, designated "post exposure bake", is done after exposure, and the third, "hard bake", is done ater development.

Referring now to FIG. 1 a conventional photoresist baking process, of the prior art, is shown. A wafer 12 after having a thin layer of photoresist 11 formed on its upper surface is placed within a controlled environment onto a hot plate 13 . The layer of photoresist 11 is cured by the transfer of heat from the wafer's backside to its top side. Heat conduction varies throughout the wafer with greater heat flow and curing occuring at the boundry layer above the points of contact between wafer and hot plate thereby causing a variance in the photoresist thickness relative to the wafer's top surface. Additionally, the wafer is more susceptible to defocusing during photolithographic exposure due to backside contamination.

FIG. 2 shows an indirect method, of the prior art, for curing photoresist using a hot plate 13 having interposing support elements 14 on its top surface thereby permitting a wafer 12 to be placed proximate to the top surface of the hot plate while resting on support elements 14.

Controlling thickness of photoresist is difficult because of the physical constraints regarding flatness, parallelism, and levelness during surface either contact or proximity backside baking techniques.

Figure 3:
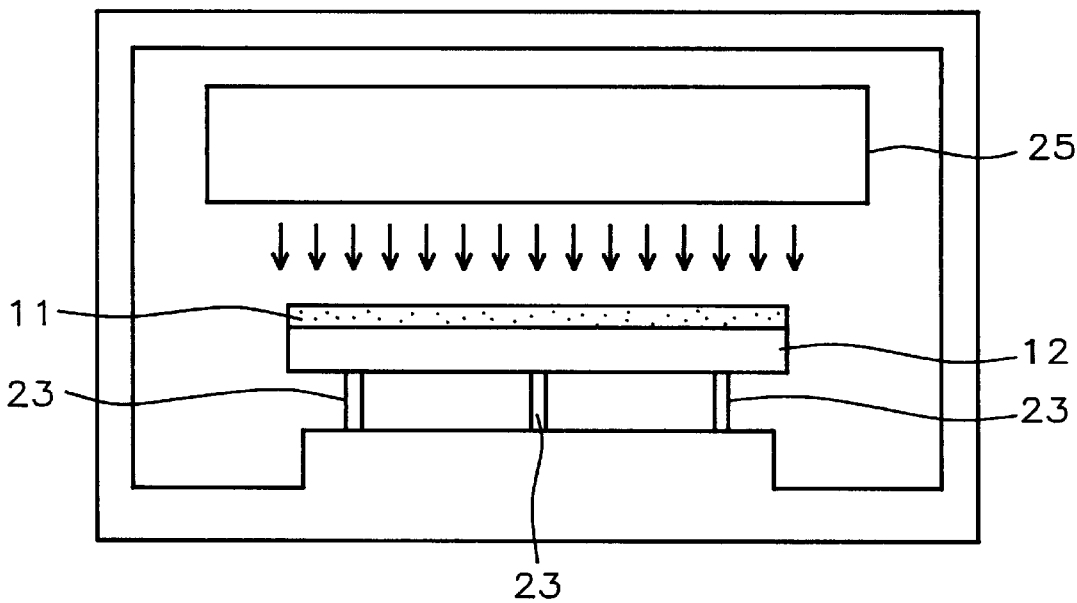
FIG. 3 is an illustration, of the present invention, showing a direct and horizontal front side photo resist baking system.
Figure 4:
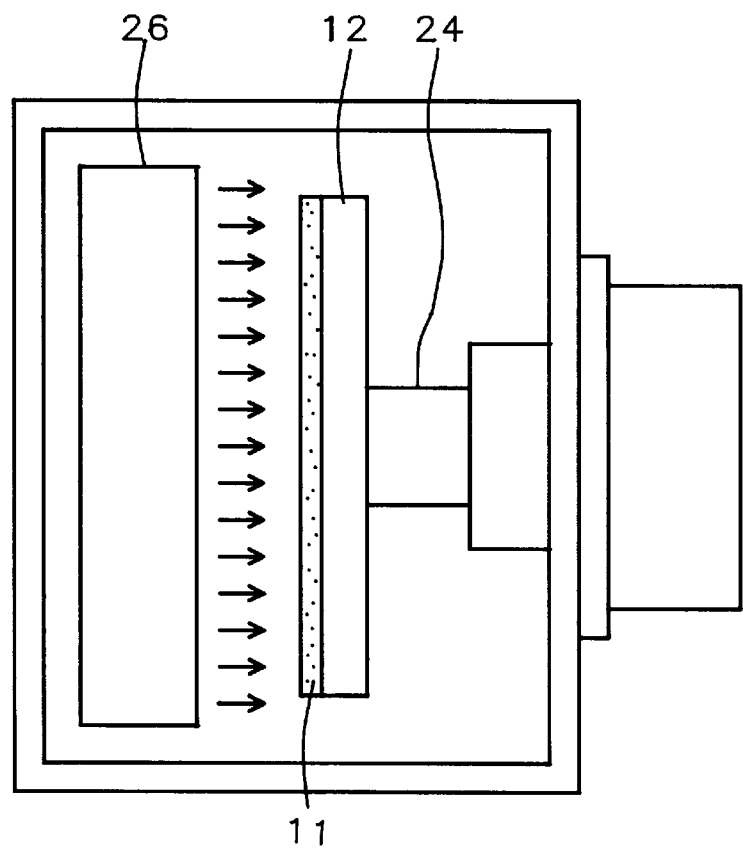
FIG. 4 is an example, of the present invention, showing a direct and vertical front side photo resist baking system.

FIGS. 3 and 4, of the present invention, both illustrate a front side baking configuration. FIG. 3 shows a wafer 12 resting horizontally on a plurality of support members 23 with its photoresist surface 11 facing a curing source 25. FIG. 4 shows a wafer 12 held vertically by a rotatable vacuum chuck 24 with its photoresist surface 11 parallel to and facing a curing energy source 26.

The horizontal configuration as illustrated in FIG. 3, is used with a radiant infra-red lamp 25 for curing the photoresist during critical layer lithography steps. This combination results in a more uniform thickness because controlling the distance and intensity of a radiant energy source is easier than that of a conventional backside conducting hot plate. During non-critical layer lithography steps, a hot gas supply in place of the infra-red lamp, is directed towards the wafer to rapidly dry and cure the photo-resist. Still another configuration is used for the non-critical lithography steps. Using a hot plate with its heated surface facing the wafer's front side is also an optional heat source replacing the hot gas supply. A cooling feature is integrated into the hot plate thereby improving process throughput.

FIG. 4 showing a vertical rotating wafer, eliminates solvent outgas contamination, is used for both post exposure bake and hard bake. Back side contamination is also avoided since the wafer is in smallest contact with the vacuum chuck.

FIG. 4 illustrates the apparatus that is used for the process of hardening an emulsion 11 on a surface of a substrate 12 that has been actinically pattern exposed and developed. An emulsion hardening chamber which includes a radiant heat source 26 and a vacuum chuck apparatus 24 having a vertical and rotatable chuck holding member. A substrate 12 is placed in the hardening chamber and vertically secured to the vacuum chuck apparatus 24 by a vacuum acting against the back side of the substrate 12. The vacuum chuck is put into rotation thereby rotating the substrate 12 about its center axis. The radiant heat source 26 is turned on and heats the emulsion side of the substrate to an intended temperature. After heat hardening of the emulsion 11, the substrate 12 is cooled and removed from the vacuum chuck apparatus 24. The radiant heat source 26 is placed in front of the vacuum chuck apparatus 24 and at a suitable distance to allow for the loading and unloading of the substrate 12.

The radiant heat source is selected from a group consisting of a radiant lamp, or a hot gas, or a hot plate, and placed in front of the emulsion's surface. Cooling of the substrate after hardening the emulsion is done by turning off the radiant heat source and directing a cooling gas flow towards the emulsion.

The preferred method illustrated in FIG. 4 shows a substrate that is vertically held by vacuum making minimum contact with the vacuum chuck is rotated during the process of hardening the emulsion 11 on the front surface of the substrate 12 that has been actinically pattern exposed and developed. The method is used for both exposure bake and hard bake. Vertical processing of the substrate eliminates solvent outgas contamination and reduces backside contamination because of the substrate's minimum contact with the vacuum chuck 24. Integration of both hardening and cooling within the same operation improves product throughput.

Figure 5:
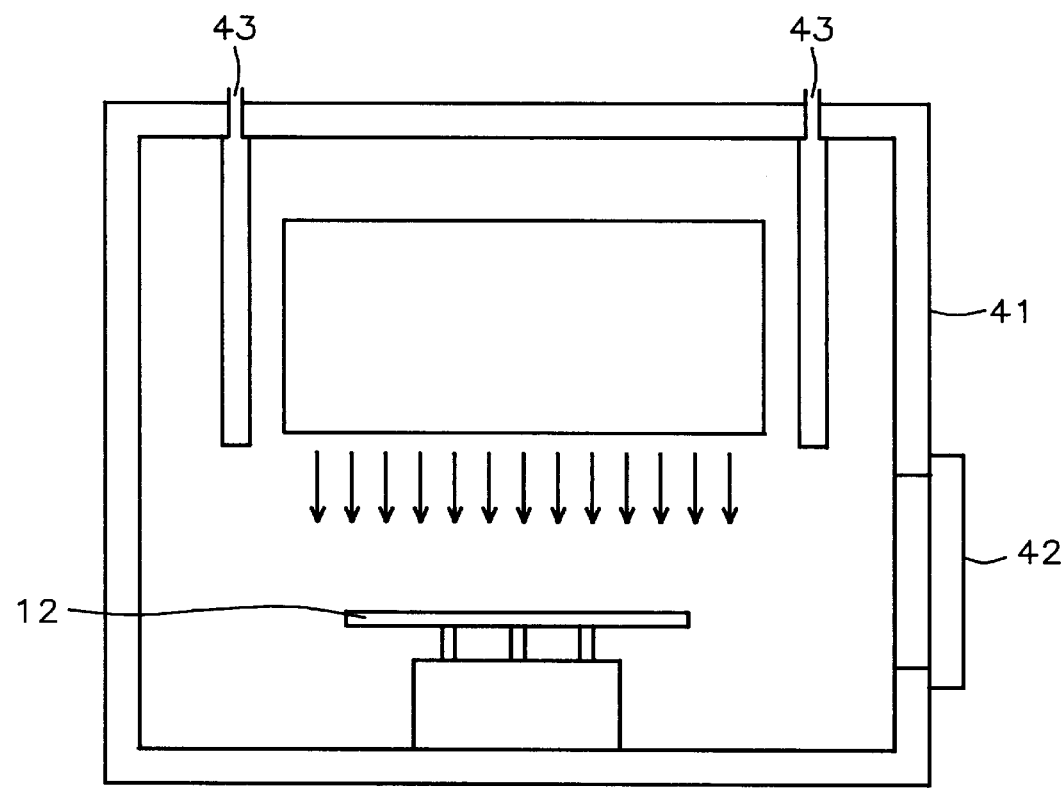
FIG. 5 is an illustration, of the present invention, simply showing a curing chamber.

FIG. 5 illustrates a curing chamber 41 having a controlled environment. Wafer 12 is placed into the curing chamber onto a support surface by way of a closeable opening 42. Evaporated solvents and the hot gas flow are collected through an exhaust port 43.

While the invention has been particularly shown and described with reference to the preferred embodiments thereof, it will be understood by those skilled in the art that various changes in form and details may be made without departing from the spirit and scope of the invention.

What is claimed is:

1. A method of hardening an emulsion on a surface of a substrate that has been actinically pattern exposed and developed, comprising the steps of:

providing an emulsion hardening chamber with a radiant heat source;

providing a vacuum chuck apparatus inside said chamber, said chuck apparatus having a vertical and rotatable chuck holding surface;

placing said substrate vertically and securing it to said vacuum chuck holding surface;

directing radiant heat to harden said emulsion;

cooling said substrate; and removing said substrate from said vacuum chuck holding surface.

2. The method of claim 1 wherein said vacuum chuck is rotateably put into motion when said radiant heat is applied to said substrate's emulsion side.

3. The method of claim 1 wherein using a radiant heat source of sufficient energy for hardening the emulsion, the radiant heat source is placed distal and frontal said emulsion's surface.

4. The method of claim 1 wherein the radiant heat source is selected from the group consisting of a radiant lamp, of a hot gas, or of a hot plate, and is placed accordingly and frontal said emulsion's surface.

5. The method of claim 1 wherein cooling the substrate after hardening the emulsion is done by turning off the radiant heat source and directing a cooling gas flow towards the emulsion whereby integrating both the hardening and cooling operations improves product throughput.

* * * * *